(12) United States Patent
Chong et al.

(10) Patent No.: US 9,214,393 B2
(45) Date of Patent: Dec. 15, 2015

(54) SURFACE TENSION MODIFICATION USING SILANE WITH HYDROPHOBIC FUNCTIONAL GROUP FOR THIN FILM DEPOSITION

(75) Inventors: Lai Wan Chong, Kaohsiung (TW); Wen Chu Hsiao, Tainan (TW); Ying Min Chou, Tainan (TW); Hsiang Hsiang Ko, Sinying (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 21 days.

(21) Appl. No.: 13/437,209

(22) Filed: Apr. 2, 2012

(65) Prior Publication Data

US 2013/0256663 A1    Oct. 3, 2013

(51) Int. Cl.
| | |
|---|---|
| H01L 21/00 | (2006.01) |
| H01L 21/8238 | (2006.01) |
| H01L 29/04 | (2006.01) |
| H01L 21/02 | (2006.01) |
| H01L 29/165 | (2006.01) |
| H01L 29/78 | (2006.01) |

(52) U.S. Cl.
CPC .. *H01L 21/823807* (2013.01); *H01L 21/02381* (2013.01); *H01L 21/02422* (2013.01); *H01L 21/02532* (2013.01); *H01L 21/02639* (2013.01); *H01L 21/823814* (2013.01); *H01L 21/823878* (2013.01); *H01L 29/04* (2013.01); *H01L 29/165* (2013.01); *H01L 29/78* (2013.01)

(58) Field of Classification Search
CPC .......................... H01L 29/04; H01L 21/823807
USPC ............................................................ 438/149
See application file for complete search history.

(56) References Cited

U.S. PATENT DOCUMENTS

| 4,279,688 A * | 7/1981 | Abrahams et al. ............... 117/89 |
| 2003/0148565 A1 * | 8/2003 | Yamanaka ..................... 438/200 |
| 2004/0259094 A1 * | 12/2004 | Odedra et al. ..................... 435/6 |
| 2005/0012099 A1 * | 1/2005 | Couillard et al. ................. 257/66 |
| 2005/0287717 A1 * | 12/2005 | Heald et al. .................... 438/128 |
| 2006/0011984 A1 * | 1/2006 | Currie ............................ 257/352 |
| 2012/0024223 A1 * | 2/2012 | Torres et al. ................... 117/104 |

* cited by examiner

*Primary Examiner* — Ajay K Arora
(74) *Attorney, Agent, or Firm* — Duane Morris LLP

(57) ABSTRACT

A semiconductor structure that includes crystalline surfaces and amorphous hydrophilic surfaces is provided. The hydrophilic surfaces are treated with silane that includes a hydrophobic functional group, converting the hydrophilic surfaces to hydrophobic surfaces. Chemical vapor deposition or other suitable deposition methods are used to simultaneously deposit a material on both surfaces and due to the surface treatment, the deposited material exhibits superior adherence qualities on both surfaces. In one embodiment, the structure is an opening formed in a semiconductor substrate and bounded by at least one portion of a crystalline silicon surface and at least one portion of an amorphous silicon oxide structure.

20 Claims, 4 Drawing Sheets

SURFACE TENSION MODIFICATION USING SILANE WITH HYDROPHOBIC FUNCTIONAL GROUP FOR THIN FILM DEPOSITION

TECHNICAL FIELD

The disclosure relates, most generally, to semiconductor devices and methods for forming the same. More particularly, the disclosure is directed to methods for treating surfaces to change the characteristics of the surfaces and enable the deposition of materials on the surfaces.

BACKGROUND

With increased levels of integration and increasingly smaller feature sizes, it is important that film deposition operations produce materials that adhere to all desired surfaces. This can be difficult to do if there is a surface tension mismatch between the film being deposited and at least some of the exposed surfaces upon which the material is being deposited. This creates a problem whereby the deposited material adheres well to some surfaces but delaminates from others.

Semiconductor devices are being manufactured to include stressor films to improve hole mobility in structures such as source/drain regions associated with MOSFET (metal oxide semiconductor field effect transistor) devices. Stressor materials are often materials with lattices that include large atoms and are formed by various thin film deposition methods. For example, SiGe materials may serve as stressor films and may be used to replace silicon and serve as source/drain structures for MOSFET's and other transistors in highly advanced semiconductor technologies. This improves device performance due to the increased hole mobility.

Source/drain structures are formed adjacent transistor gates that are disposed on a semiconductor substrate surface. When materials such as stressor materials are used for the source/drain regions, openings are formed in the semiconductor substrate adjacent the transistor gates. The desired materials must then be introduced into the openings using various deposition methods.

Another artifact of the high levels of integration is the presence of shallow trench isolation ("STI") devices formed in the substrate in close proximity to the transistors. STI devices isolate active devices from other active devices. When the openings formed in a substrate are partially bounded by STI structures, the openings thus have different types of surfaces upon which the deposited material must adhere.

STI structures can exhibit surface tension characteristics that are different than the other surfaces of the opening in which the material is formed. One shortcoming associated with current methods and structures is the difficulty in overcoming the surface tension mismatch between the deposited material and at least one of the surfaces that border the opening.

The present disclosure addresses the shortcomings and addresses other needs in semiconductor manufacturing.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides a method for forming a thin film on a surface that has a mismatched surface tension with respect to the material being deposited. In one embodiment, the method is used to deposit SiGe on an oxide layer. In one embodiment, the oxide layer is the surface of a shallow trench isolation ("STI") structure. The method includes using a silane with a hydrophobic functional group to treat a hydrophilic surface such as a silicon oxide. The silane with the hydrophobic functional group forms a molecular monolayer on the hydrophilic surface effectively converting the hydrophilic surface to a hydrophobic surface. Hydrophobic films such as Si and SiGe preferentially adhere to hydrophobic surfaces. When a silane with a hydrophobic functional group is used to selectively treat the hydrophilic surfaces, a film such as SiGe may be successfully deposited on previously incompatible surfaces such as the silicon oxide surface. During the deposition operation, the SiGe film will also selectively deposit on other exposed surfaces with different surface tension characteristics. In other embodiments, other hydrophobic type films may be deposited. The disclosure thus provides for such a film to be simultaneously and successfully deposited on surfaces with different surface tension characteristics. In one embodiment, the disclosure provides for the deposition of a film that selectively deposits on a hydrophobic crystalline surface such as silicon, to also deposit on an oxide surface by changing the surface characteristics of the oxide surface.

Broadly speaking, the disclosure provides for providing a substrate having different exposed surfaces with different associated surface characteristics, and selectively treating one of the surfaces to change its surface characteristic. This enables a film deposition operation to be carried out which successfully forms a film with good adhesion properties on multiple exposed surfaces. When the two different surfaces are surfaces that bound an opening, the disclosure enables the deposited material to completely fill the opening.

Figure 1:
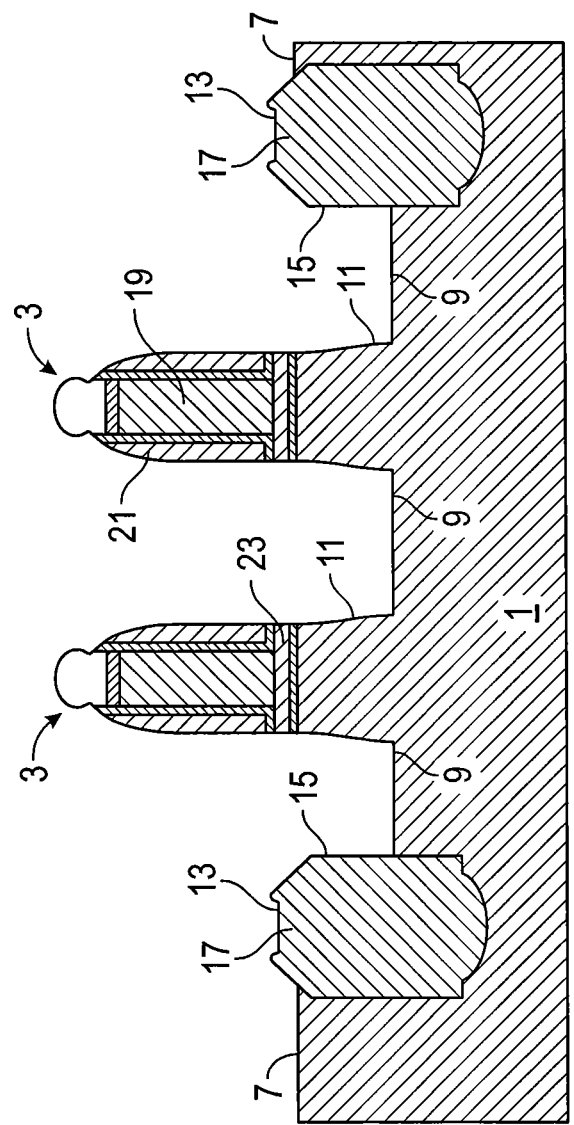
FIG. 1 is a cross-sectional view showing an embodiment of transistors utilizing source/drain materials formed in openings in a substrate upon which the transistors are formed.

FIG. 1 shows openings formed in substrate 1. In one embodiment, substrate 1 is formed of silicon. In one embodiment, the silicon is single crystal silicon. In other embodiments, substrate 1 is formed of other crystalline materials suitable for use in the semiconductor manufacturing industry. The openings are formed adjacent transistor gates 3 and extend downwardly from substrate surface 7. The openings are bounded by bottom surfaces 9 and sidewall surfaces 11, each formed of the substrate material.

The openings formed on the left and right hand sides of FIG. 1 are also bounded by surfaces 15 of STI structures 17.

STI structures 17 are formed of silicon dioxide in one embodiment. In other embodiments, STI structures 17 are formed of other silicon oxides or other suitable insulating materials. Transistor gates 3 include gate electrodes 19, spacers 21 and gate dielectric 23 in the illustrated embodiment. In other embodiments, transistor gates 3 may include different structures. Gate electrodes 19 and spacers 21 may be formed of various suitable materials and transistor gates 3 do not include exposed crystalline surfaces. According to one embodiment, spacers 21 are formed of silicon nitride. Top surfaces 13 of STI structure 17 are covered with other non-oxide materials such as polysilicon, nitride or another transistor gate, not shown in FIG. 1, which may be a dummy structure to cover top surfaces 13 and may be formed using the process operations used to form other device structures such as transistor gates 3. These structures are represented by blocking structure 25, which will be shown in FIG. 2A. According to the embodiment in which substrate 1 is formed of a hydrophobic material such as silicon, bottom surfaces 9 and sidewall surfaces 11 are hydrophobic. STI structures 17 are amorphous and hydrophilic in nature.

Surfaces 15 of STI structures 17 are thus amorphous in nature and are hydrophilic surfaces, i.e. surfaces that are attracted to water. Surfaces 15 of STI structures 17 have different surface tension characteristics than do bottom surface 9 and sidewall surfaces 11 which are hydrophobic crystalline surfaces. According to one embodiment, STI structure 17 and hydrophilic surface 15 is formed of a silicon oxide. Due to surface tension mismatches, many materials such as materials that are suitably used as stressor materials in semiconductor devices, have a surface tension mismatch that prevents proper bonding with hydrophilic surface 15 of STI structures 17. In some embodiments, materials will preferentially and selectively deposit on other surfaces which are crystalline and/or hydrophobic in nature but not on hydrophilic surfaces. In one embodiment, the contact angle of a hydrophobic surface such as Si is about 80°, whereas the contact angle of silicon oxide, e.g. hydrophilic surface 15, is about 0°. A contact angle is the angle at which a liquid/vapor interface meets a solid surface. Molecules of a liquid that are strongly attracted to the molecules of a solid, e.g. water on a strongly hydrophilic solid, will completely spread out when a drop of the liquid is placed on a solid surface, corresponding to a contact angle of 0°. If the solid surface is hydrophobic, the drop of liquid will adhere to itself and form a contact angle larger than 90°.

In one embodiment, SiGe is the deposited material. SiGe is deposited using methods that cause SiGe to preferentially deposit by epitaxial growth, on exposed hydrophobic surfaces in one embodiment. According to this embodiment, if SiGe is deposited on the structure shown in FIG. 1 without the surface treatment of the disclosure, the deposition of SiGe will be incomplete in the openings as the SiGe will tend not to deposit on or along hydrophilic surfaces 15. Rather, SiGe will preferentially deposit on bottom surface 9 and sidewall surfaces 11 which are hydrophobic crystalline surfaces.

In order to avoid this and enable the complete deposition of SiGe on hydrophilic surface 15, the disclosure provides for selectively treating the hydrophilic surfaces 15 with a silane solution including a hydrophobic functional group. A hydrophobic material is a material that is repelled from a mass of water. The treatment can be carried out by introducing a silane solution with a hydrophobic functional group, to the structure shown in FIG. 1. The treatment modifies the hydrophilic surfaces 15 such as silicon oxide surfaces by forming a silane monolayer. This treatment and the formation of the silane-based hydrophobic monolayer increases the contact angle of the silicon oxide surface to about 100° in one embodiment and converts the hydrophilic surface to a hydrophobic surface.

The structure shown on FIG. 1 may be treated with the silane solution that includes a hydrophobic functional group, by immersing the substrate in a silane solution. In one embodiment, no power is applied to the solution and the solution is an organic solution at room temperature. In other embodiments, other temperatures are used. In other embodiments, electrical power is supplied to the solution. The silane solution is in a stagnant bath in one embodiment. In another embodiment, the silane solution is in a bath that is agitated, cascading or is a recirculating bath. In still other embodiments, the silane solution is applied to the substrate by spraying or using other immersion techniques in a wet processing apparatus. Other methods for introducing the silane solution to the structure in FIG. 1 are used in other embodiments.

In one embodiment, the hydrophobic functional group includes fluorine or chlorine. In another embodiment, the hydrophobic functional group includes ammonia. In one embodiment, the hydrophobic group is dodecyltriethoxysilane or trichlorododecylsilane. In another embodiment, the hydrophobic group is 3,3,3-trifluoropropyl trichlorosilane or 3,3,3-trifluoropropyl trimethoxysilane. Other suitable hydrophobic functional groups are used in other embodiments.

Figure 2A:
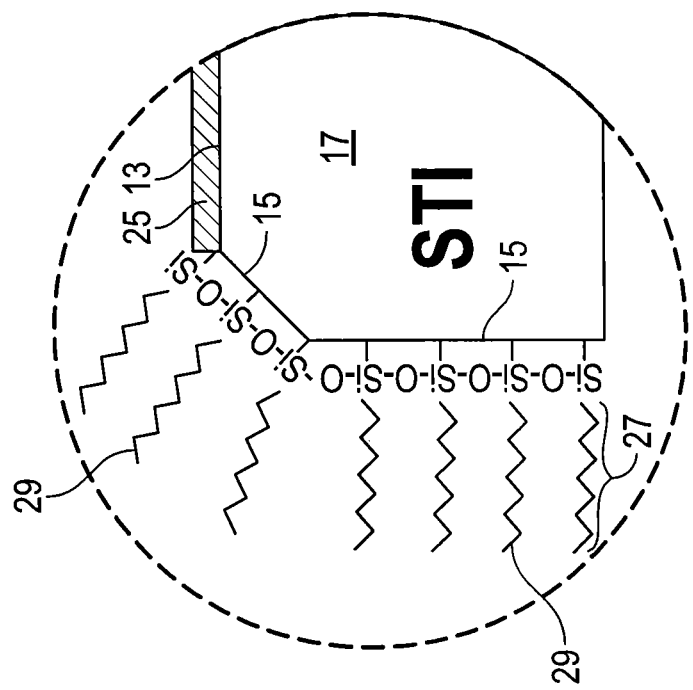
FIG. 2A is an expanded view of the indicated portion of FIG. 2.
Figure 2:
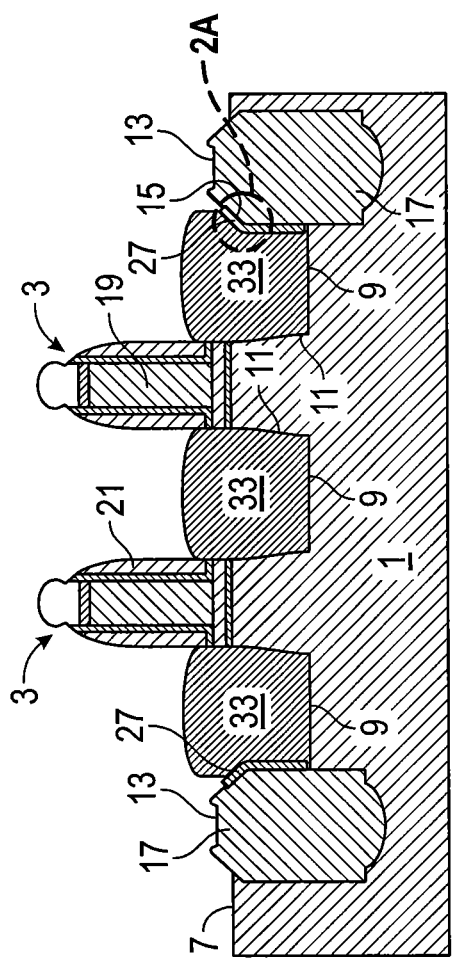
FIG. 2 is a cross-sectional view showing the structure shown in FIG. 1 after a film has been formed in the openings.

The hydrophobic functional group selectively reacts with hydrophilic surface 15 of STI structures 17 to form hydrophobic monolayer 27 shown in FIG. 2. Hydrophobic monolayer 27 is also shown more clearly in FIG. 2A which illustrates the hydrophobic monolayer 27 and only an expanded portion of STI structure 17 of FIG. 2. Hydrophobic monolayer 27 is a molecular monolayer in some embodiments. In one embodiment, a reaction between the Si of the silane, and the hydroxy group of STI structure 17 causes the silane to form an SiO bond with hydrophilic (silicon oxide) surface 15 and produce hydrophobic monolayer 27. Hydrophobic monolayer 27 has outwardly exposed hydrophobic functional groups 29 shown in FIG. 2A thereby causing STI structure 17 to have exposed surfaces that are hydrophobic in nature. FIG. 2A also shows top surface 13 covered by previously described blocking structure 25 formed of a material other than silicon oxide and upon which the hydrophobic monolayer 27 does not form.

Figure 3:
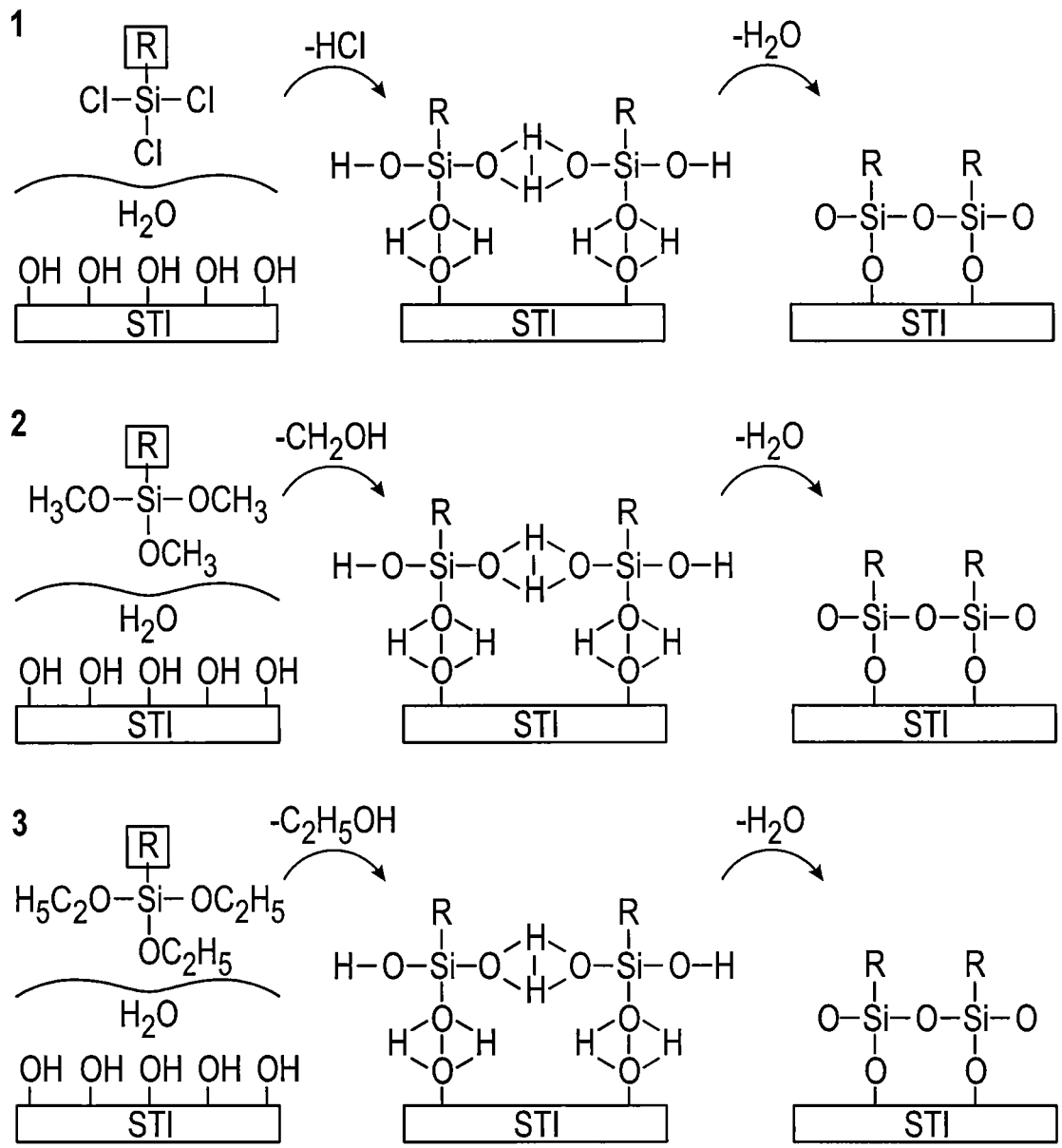
FIG. 3 shows three embodiments of reactions that form hydrophobic monolayers.

In various embodiments, the molecular structure of silane can be R—$SiCl_3$, R—$SiOC_2H_6$ or R—$SiOCH_3$, with R representing the hydrophobic functional group of silane. Various embodiments of reactions between silane and hydrophilic surface 15 of STI structures 17 (including OH group) to produce the hydrophobic monolayer, include but are not limited to, the reactions shown in FIG. 3. The reactions shown in FIG. 3 are intended to represent examples of the various reaction embodiments.

In one embodiment, the conditions of the silane solution are controlled so that the silane solution preferentially reacts only with exposed oxide surfaces and not other surfaces such as crystalline silicon, polysilicon, silicon nitride or silicon oxynitride materials. The time and concentration of the silane solution is controlled according to one embodiment. The conditions of the silane solution are controlled so that the silane solution reacts preferentially with the exposed hydrophilic surfaces, and not with hydrophobic surfaces.

FIG. 2A is provided in expanded view and shows hydrophobic monolayer 27 arbitrarily expanded in size for clarity purposes. It can be appreciated that the treatment with the silane having the hydrophobic functional group, selectedly reacts with the silicon oxide of hydrophilic surface 15 and converts hydrophilic surface 15 to a hydrophobic surface on a macroscopic level. An alternative description is that, on a molecular level, a hydrophobic monolayer 27 is formed over hydrophilic surface 15. At any rate, the exposed surfaces of STI structures 17 are hydrophobic after silane treatment.

Still referring to FIG. 2, various film deposition techniques are then used to selectively deposit material 33 into the previously existing openings bounded by bottom surfaces 9, sidewall surfaces 11 and STI structure 17 which has an exposed surface of hydrophobic monolayer 27. Bottom surfaces 9 and sidewall surfaces 11 are crystalline surfaces and hydrophobic monolayer 29 is amorphous in nature. In other embodiments, material 33 may be deposited onto other structures that include exposed crystalline surfaces and originally hydrophilic surfaces that have been converted to hydrophobic surfaces in accordance with the disclosure.

Chemical vapor deposition, CVD, is used to deposit material 33 in one embodiment. Various selective deposition methods may be used that cause the selective epitaxial growth of the deposited film upon exposed crystalline surfaces. In one embodiment, reduced pressure chemical vapor deposition, RPCVD, is used. Other CVD and other film deposition techniques are used in other embodiments. In one embodiment, material 33 is SiGe is advantageously introduced into the opening adjacent transistor gates 3 for use as stressor materials as source/drain regions of the associated transistors. Material 33 advantageously adheres to STI structure 17 having exposed hydrophobic monolayer 27 as its exposed surface. Material 33 also advantageously adheres to crystalline materials of bottom surface 9 and sidewall surface 11. In other embodiments, other materials that preferentially adhere to hydrophobic surfaces and crystalline structure are used. Examples of such materials that preferentially selectively deposit onto crystalline surfaces using epitaxial growth and also adhere to hydrophobic surfaces include Si, SiGe and SiC. Bottom surface 9 and sidewall surfaces 11 have different surface tensions than original hydrophilic surface 15. The presence of hydrophobic monolayer 27 effectively converts the hydrophilic surface to a hydrophobic surface and changes its surface tension, enabling material 33 to advantageously adhere to STI structure 17 and to the crystalline materials of bottom surface 9 and sidewall surface 11. The conversion can be described, in one embodiment, as a change in the contact angle of the surfaces. The contact angle of bottom surface 9 and sidewall surfaces 11 is about 80° and the contact angle of surface 15 is changed from about 0° to about 100° in one embodiment, as a result of the conversion using hydrophobic monolayer 27. FIG. 2 shows that material 33 completely adheres to all surfaces.

The structure shown in FIGS. 1-2 represent one embodiment only and the methods of the disclosure may be used in other embodiments to form SiGe or other materials that preferentially and selectively form due to epitaxial growth on crystalline surfaces. According to the surface treatment of the disclosure, such films can be simultaneously formed using one deposition operation, on both the crystalline surfaces and originally hydrophilic surfaces that have been converted to hydrophobic surfaces according to the silane treatment of the disclosure. This includes various different structures of semiconductor devices in the semiconductor manufacturing industry.

Figure 4:
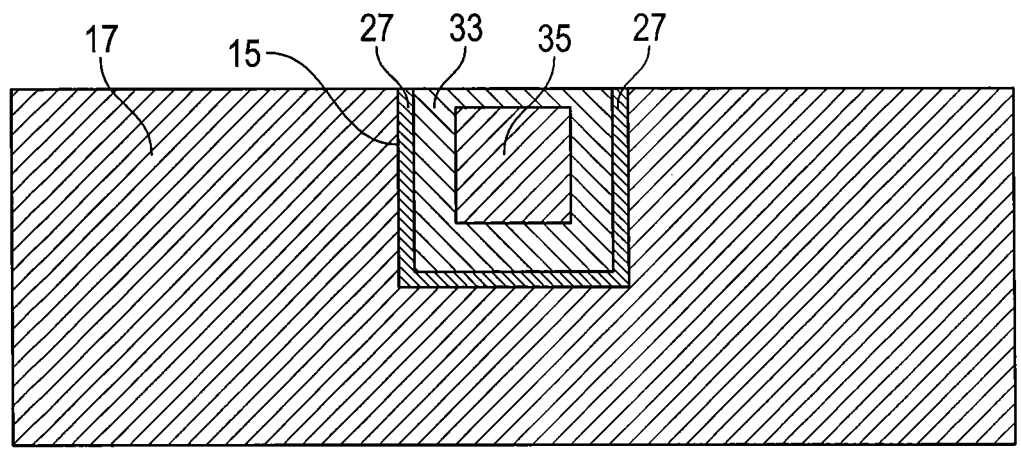
FIG. 4 is a top, plan view showing a deposited film and monolayer according to an embodiment of the disclosure.

FIG. 4 is a top, plan view showing an embodiment of material 33 formed in an opening surrounded by STI structure 17. In the illustrated embodiment, the three illustrated sides of material 33 are bounded by STI structure 17. Hydrophobic monolayer 27 is formed between STI structure 17 and material 33. More particularly, hydrophobic monolayer 27 is disposed between hydrophilic surface 15 and material 33. The dimensions of hydrophobic monolayer 27 have been arbitrarily expanded for clarity in FIG. 4. Contact structure 35 is formed over material 33 and provides contact to material 33. Material 33 completely fills the opening in which it is formed due to the conversion of previously hydrophilic surface 15 to a hydrophobic surface due to hydrophobic monolayer 27. Material 33 adheres well to surfaces of STI structures 17. This improves the integrity of the contact between contact structure 35 and material 33. In contrast, if the surface of STI structure 17 had not been converted to a hydrophobic surface according to the disclosure, material 33 would have an incompatible surface tension with the surfaces of STI structure 17 and would not adhere properly to STI structure 17 leaving voids in material 33 such that contact structure 35 might extend through the voids in material 33 and undesirably contact an underlying structure.

Figure 5:
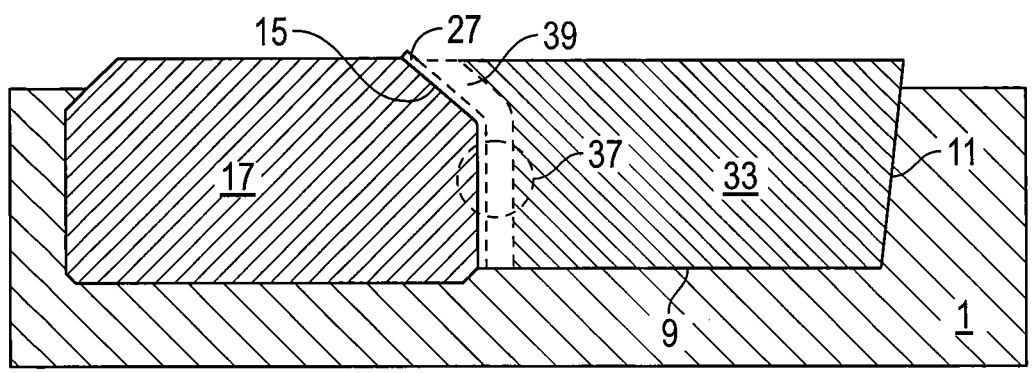
FIG. 5 is a cross-sectional view showing a structure including a monolayer according to an embodiment of the disclosure.

FIG. 5 is an expanded cross-sectional view showing the interfaces between material 33 and the surfaces upon which material 33 is formed. In one embodiment, material 33 is crystalline in nature and therefore the interface between material 33 and sidewall surfaces 11 and bottom surface 9 is crystalline in nature. This is due to the selective epitaxial growth of material 33 upon crystalline sidewall surfaces 11 and bottom surface 9 according to one embodiment.

Interface 37 between material 33 and STI structure 17 is of a different nature. Interface 37 includes hydrophilic surface 15, hydrophobic monolayer 27 and an amorphous semiconductor portion 39 of material 33 adjacent hydrophobic monolayer 27. Amorphous portion 39 of material 33 is amorphous in nature because it forms an interface with STI structure 17 which is amorphous in nature. More particularly, amorphous portion 39 of material 33 is amorphous in nature because it forms an interface with hydrophobic monolayer 27 disposed on amorphous hydrophilic surface 15. The structure shown in FIG. 5 therefore includes a first portion that includes a crystalline interface between crystalline material 33 and the crystalline surfaces of bottom surface 9 and sidewall surface 11. The structure also includes a second portion in which interface 37 includes an amorphous portion 39 of material 33 formed adjacent hydrophobic monolayer 27. In some embodiments, material 33 is suitably used as a stressor material and serves as a source/drain portion of the transistor, not shown.

In one embodiment, a method for depositing a film on a surface is provided. The method comprises: providing a hydrophilic surface; treating the hydrophilic surface with a silane that includes a hydrophobic functional group, thereby converting the hydrophilic surface to a hydrophobic surface; and depositing a material that preferentially adheres to a hydrophobic surface, onto the hydrophobic surface.

In another embodiment, a method for depositing a film on a surface is provided. The method comprises: providing a structure on a substrate, the structure including a hydrophilic surface and at least a further surface; treating the hydrophilic surface with a silane that includes a hydrophobic functional group, thereby forming a hydrophobic monolayer on the hydrophilic surface; and depositing a material that preferentially adheres to a crystalline surface, onto the structure.

In another embodiment, a semiconductor device is provided. The semiconductor device comprises: a structure on a substrate, the structure including a first portion with a hydrophilic surface and a second portion with a crystalline surface; a material disposed on the structure, wherein a first interface between the material and the first portion includes a hydrophobic monolayer on the hydrophilic surface and an amorphous semiconductor material portion between the hydrophobic monolayer and the material; and a second interface between the material and said crystalline surface is crystalline.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for depositing a film on a surface, said method comprising:
   providing a substrate having a shallow trench isolation (STI) structure with a hydrophilic surface, the substrate having a source or drain opening including a crystalline surface adjacent the hydrophilic surface;
   treating said hydrophilic surface with a silane that includes a hydrophobic functional group, thereby converting said hydrophilic surface to a hydrophobic surface in the source or drain opening; and
   depositing a material that preferentially adheres to a hydrophobic surface and selectively deposits on a crystalline lattice, onto said hydrophobic surface in the source or draining opening and said crystalline surface simultaneously after the treating.

2. The method as in claim 1, wherein said depositing a material comprises a selective film formation operation that selectively causes said material to epitaxially grow on exposed crystalline surfaces.

3. The method as in claim 1, wherein said hydrophilic surface is silicon dioxide and said material is SiGe.

4. The method as in claim 1, wherein said hydrophobic surface comprises a hydrophobic molecular monolayer formed on said hydrophilic surface and wherein said treating includes forming said hydrophobic molecular monolayer on said hydrophilic surface.

5. The method as in claim 1, wherein said hydrophilic surface is a surface of the shallow trench isolation structure that forms at least one side of the source or drain opening, the substrate is a silicon substrate, and said depositing a material comprises depositing said material on silicon surfaces of said opening and filling said opening with said material.

6. The method as in claim 5, wherein said material comprises SiGe, and said opening is adjacent a transistor gate and said filling said opening comprises forming a source/drain region.

7. The method as in claim 1, wherein said silane comprises one of dodecyltriethoxysilane, trichlorododecylsilane, 3,3,3-trifluoropropyl trichlorosilane, and 3,3,3-trifluoropropyl trimethoxysilane.

8. The method as in claim 1, wherein said hydrophobic functional group includes ammonia, and said depositing comprises reduced pressure chemical vapor deposition (RPCVD).

9. The method as in claim 1, wherein said silane is a silane solution and said treating comprises disposing a substrate including said hydrophilic surface, in said silane solution.

10. A method for depositing a film, said method comprising:
    providing a semiconductor substrate including a shallow trench isolation (STI) structure having a hydrophilic surface, said substrate having at least one source or drain opening having a crystalline silicon surface therein, adjacent the STI structure, wherein the hydrophilic surface forms a sidewall of the source or drain opening;
    immersing said substrate in a liquid silane that includes a hydrophobic functional group, thereby forming a hydrophobic monolayer on said hydrophilic surface; and
    depositing a material that selectively adheres to a hydrophobic surface and selectively deposits on a crystalline lattice, onto said sidewall of the STI structure and onto said crystalline silicon surface of said source or drain opening simultaneously after said immersing.

11. The method as in claim 10, wherein said silane comprises one of dodecyltriethoxysilane, trichlorododecylsilane 3,3,3-trifluoropropyl trichlorosilane, and 3,3,3-trifluoropropyl trimethoxysilane.

12. The method as in claim 10, wherein said material comprises SiGe, said hydrophilic surface comprises a silicon oxide and said depositing comprises said material epitaxially growing on said crystalline silicon surface.

13. The method as in claim 10, wherein said depositing a material comprises filling said opening with SiGe and further comprising providing a transistor gate on said substrate adjacent said opening.

14. A method for depositing a film on a surface, said method comprising:
    providing a silicon substrate having a shallow trench isolation (STI) structure with a continuous hydrophilic surface and a source or drain opening having a crystalline silicon surface adjacent the continuous hydrophilic surface, wherein the continuous hydrophilic surface of the STI structure forms a sidewall of the source or drain opening;
    treating said continuous hydrophilic surface of the STI structure with a silane that includes a hydrophobic functional group, thereby converting said continuous hydrophilic surface to a continuous hydrophobic surface; and depositing a crystalline SiGe material that is crystalline as deposited and preferentially adheres to a hydrophobic surface and selectively deposits on a crystalline lattice, directly and continuously onto said continuous hydrophobic surface of the STI structure and the crystalline silicon surface of the source or drain opening simultaneously after the treating.

15. The method as in claim 14, wherein said depositing a crystalline material comprises a selective film formation operation that selectively causes said crystalline material to epitaxially grow on said continuous hydrophobic surface.

16. The method as in claim 14, wherein said hydrophilic surface is a silicon dioxide surface.

17. The method as in claim 14, wherein said hydrophobic surface comprises a hydrophobic molecular monolayer formed on said hydrophilic surface and wherein said treating includes forming said hydrophobic molecular monolayer on said hydrophilic surface.

18. The method as in claim 14, wherein said silane comprises one of dodecyltriethoxysilane, trichlorododecylsilane, 3,3,3-trifluoropropyl trichlorosilane, and 3,3,3-trifluoropropyl trimethoxysilane.

19. The method as in claim 14, wherein said hydrophobic functional group includes ammonia, and said depositing comprises reduced pressure chemical vapor deposition (RPCVD).

20. The method of claim 14, wherein said treating includes immersing the silicon substrate in the silane.

* * * * *